United States Patent [19]

Heller

[11] 4,246,496
[45] Jan. 20, 1981

[54] VOLTAGE-TO-CHARGE TRANSDUCER

[75] Inventor: Lawrence G. Heller, Essex, Vt.

[73] Assignee: International Business Machines Corporation, Armonk, N.Y.

[21] Appl. No.: 925,150

[22] Filed: Jul. 17, 1978

[51] Int. Cl.³ .................. G11C 19/28; H01L 29/78
[52] U.S. Cl. .................. 307/221 D; 357/24
[58] Field of Search .................. 357/24; 307/221 D

[56] References Cited

U.S. PATENT DOCUMENTS

| 3,656,011 | 4/1972 | Weinberg | 357/24 |
|---|---|---|---|
| 3,902,186 | 8/1975 | Engeler et al. | 357/24 |
| 4,035,667 | 7/1977 | Heller | 307/221 D |
| 4,047,051 | 9/1977 | Heller | 307/221 D |
| 4,085,459 | 4/1978 | Hirabayashi | 307/221 D |

OTHER PUBLICATIONS

Jespers et al., "A Fast Sample and Hold Charge-Sensing Circuit for Photodiode Arrays" IEEE J. Solid-State Circuits vol. SC-12 (6/77) pp. 232-237.
Lee, "Converter for CCD Multilevel Shift Registers" IBM Technical Disclosure Bulletin vol. 20 (1/78) pp. 3011-3013.
Hiltebeitel et al., "Fractional Charge Packet Generator" IBM Technical Disclosure Bulletin vol. 20 (1/78) pp. 3014-3016.

Primary Examiner—Gene M. Munson
Attorney, Agent, or Firm—Stephen J. Limanek

[57] ABSTRACT

A voltage-to-charge transducer utilizing a capacitor circuit is provided to generate whole or fractional charge packets at spaced apart locations in a semi-conductor substrate. Each of a pair of conductive lines connected to opposite sides of the capacitor circuit is selectively precharged to a predetermined voltage value by means of one of a pair of charge transfer devices coupled to the input of first and second charge coupled device (CCD) storage systems. Means are also provided for applying voltages of first and second magnitudes to each of the pair of conductive lines. By precharging one of the pair of conductive lines to the predetermined voltage value and by altering the voltage on the other of the pair of conductive lines from the first magnitude to the second magnitude, a first charge packet is formed in a well of the first CCD storage system. To inject a duplicate of the first packet into a well of the second CCD storage system, similar voltages are established across the capacitor circuit relative to the second CCD storage system. To inject into the second CCD storage system a charge packet which is a fraction of the first packet, the similar voltages differ only in that the voltage difference between the first and second magnitudes is altered to a fraction equal to the fraction of the desired fractional charge packet. By precharging the conductive lines coupled to the capacitor circuit, parasitic effects are neutralized or eliminated in the transducer.

10 Claims, 4 Drawing Figures

VOLTAGE-TO-CHARGE TRANSDUCER

DESCRIPTION

2. Technical Field

This invention relates to charge transfer devices and more particularly to an improved transducer for producing duplicate and fractional charge packets at spaced apart locations in a semiconductor substrate.

2. Background Art

Generation of packets of charge for charge coupled device (CCD) storage systems and for transferring charge from one storage well to another in charge transfer systems is well known. Furthermore, CCD storage systems utilizing multi-valued signals or multi-levels of charge at a given storage location to represent three or more binary digits of information are also known as, for example, disclosed in IBM Technical Disclosure Bulletin, Vol. 20, No. 8, January 1978, pp. 3011–3013, in an article entitled, "Converter for CCd Multilevel Shift Registers" by H. S. Lee. U.S. Pat. No. 4,085,459, filed Sept. 10, 1976, discloses injecting multi-valued signals with at least three information carrying voltage levels in the form of electric charges to a CCD system. Also, means for producing fractional charge packets are disclosed in the H. S. Lee article as well as in IBM Technical Disclosure Bulletin, Vol. 20, No. 8, Jan. 1978, pp. 3014–3016, in an article entitled "Fractional Charge Packet Generator" by J. A. Hiltebeitel and N. G. Vogl, Jr. by storing a given quantity of charge in a particular well and then directing one half of the given quantity of charge into each of two adjacent wells. In commonly assigned U.S. Pat. No. 4,047,051, filed Oct. 24, 1975, there is disclosed a method and apparatus for duplicating or replicating a charge packet by introducing a given charge packet into a first well, which when the voltage on the electrode associated with that well is pulled down causes current flow to restore the voltage on that electrode which in turn transfers charge carriers of a like quantity of charge from a source diffusion into a second well under a second electrode. In another commonly assigned U.S. Pat. No. 4,035,667, filed Dec. 2, 1975, there is described an input circuit for injecting charge packets with little or no distortion into a CCD storage system in a linear manner such that the charge injected is independent of the input circuit threshold and capacitance.

DISCLOSURE OF THE INVENTION

It is an object of this invention to provide an improved method for generating charge packets at spaced apart locations in a semiconductor substrate wherein requirements on capacitor tracking are eliminated. It is another object of this invention to provide an improved method of generating charge packets at selected spaced apart locations in a semiconductor substrate wherein a voltage rather than a charge is distributed to the selected locations.

It is yet another object of this invention to provide an improved method and apparatus wherein parasitic capacitances do not effect the distribution or generation of charge packets at the selected spaced apart locations.

It is still another object of this invention to provide an improved method and apparatus for generating charge packets of various sizes at selected spaced apart locations on a semiconductor substrate at relatively high speeds.

In accordance with the teachings of this invention a voltage-to-charge transducer utilizing a capacitor circuit is provided for generating whole or fractional charge packets at selected spaced apart locations in a semiconductor substrate. Each of a pair of conductive lines connected to opposite sides of the capacitor circuit is selectively precharged to a predetermined voltage value by means of one of a pair of charge transfer devices coupled to the input of first and second charge utilization systems. Means are also provided for applying voltages of first and second magnitudes to each of the pair of conductive lines. By precharging one of the pair of conductive lines to the predetermined voltage value and by altering the voltage on the other of the pair of conductive lines from the first magnitude to the second magnitude, a first charge packet is formed in a well of the first charge utilization system. To inject a duplicate of the first packet into a well of the second charge utilization system, similar voltages are established across the capacitor circuit relative to the second charge utilization system. To inject into the second charge utilization system a charge packet which is a fraction of the first packet, the similar voltages differ only in that the voltage difference between the first and second magnitudes is altered to a fraction equal to the fraction of the desired fractional charge packet. By precharging the conductive lines coupled to the capacitor circuit, parasitic effects are rendered ineffective during the charge injection process. In one embodiment of the invention the capacitor circuit includes a single capacitor serially connected between the first and second utilizing circuits and in a second embodiment, two serially connected capacitors are utilized between the first and second utilizing circuits to provide improved performance.

The foregoing and other objects, features and advantages of the invention will be apparent from the following more particular description of the preferred embodiments of the invention, as illustrated in the accompanying drawings.

DESCRIPTION OF THE PREFERRED EMBODIMENTS

In many charge transfer or CCD storage systems, it is desirable to generate duplicate and/or half-level charge packets at multiple points on a semiconductor substrate or chip, preferably in a manner which is independent of capacitor tracking. For example, for binary storage of 1 and 0 bits of information, charge packets Q1 and Q0 are inserted at the input to the CCD storage system while at the output of the system a half-level charge packet, that is (Q1−Q0)/2 is required for sensing the binary information. The charge packet Q1 may be a whole packet containing a given quantity of charge and packet Q0 may be devoid of any charge. In multilevel CCD storage systems wherein one charge packet may represent more than one bit of information, fractional packets other than the one half level are required.

Figure 1:
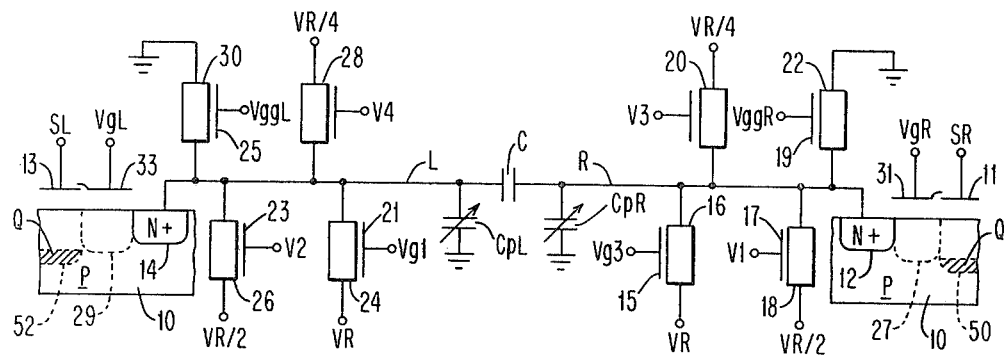
FIG. 1 illustrates primarily a circuit diagram in accordance with the teachings of one embodiment of the present invention.
Figure 2:
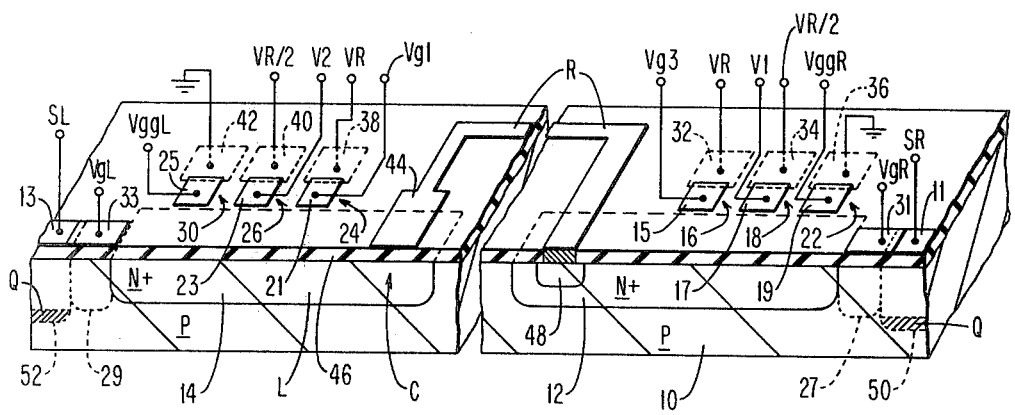
FIG. 2 is an integrated semiconductor structure of the circuit illustrated in FIG. 1 shown in isometric view with a section taken therethrough.
Figure 3:
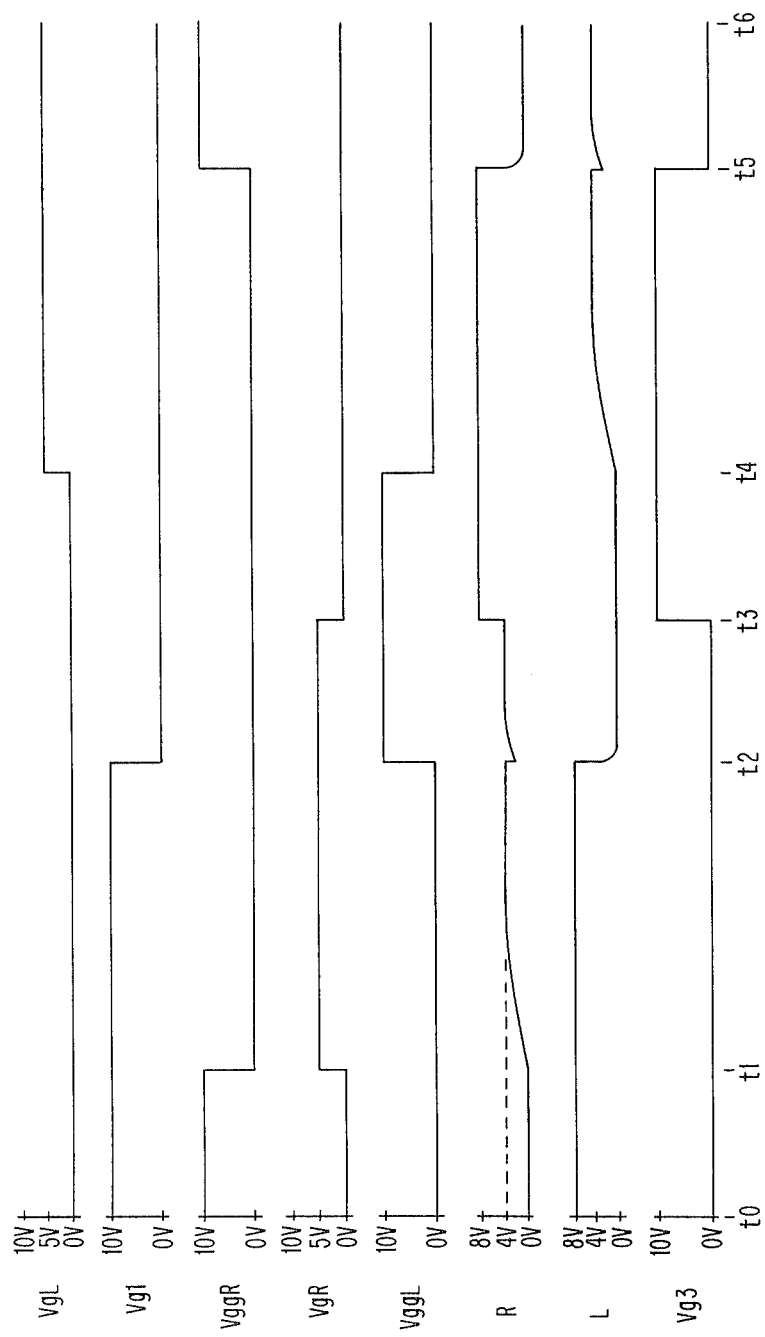
FIG. 3 is a pulse program which may be used for operating the circuit of the embodiment illustrated in FIGS. 1 and 2.

An embodiment of a circuit and a method of generating capacitor tracking independent charge packets at spaced apart locations on a semiconductor substrate in accordance with the present invention is illustrated in FIGS. 1, 2 and 3 of the drawings. As seen in FIG. 1, a first stage of a first CCD storage system is indicated by a first storage electrode 11 which is insulated from a semiconductor substrate 10, preferably made of silicon. Formed within the semiconductor substrate 10 is a first N+ diffusion, identified by reference numeral 12, for supplying charges, more specifically, electrons, to the first CCD storage system. A first stage of a second CCD storage system indicated by a second storage electrode 13 insulated from the substrate 10 is spaced apart from the first storage electrode 11. A second N+ diffusion, identified by reference numeral 14, is formed in the substrate 10 to generate charges, that is, electrons, for injection into the second CCD storage system. The circuit or voltage-to-charge transducer of the present invention further includes a capacitor C connected at one electrode or plate to the first N+ diffusion 12 by means of a conductive line R and at the other electrode or plate to the second N+ diffusion 14 by means of the conductive line L. The capacitance of capacitor C may, e.g., have a value of $20 \times 10^{-15}$ farads. The first conductive line R has a parasitic capacitance CpR and the second conductive line L has a parasitic capacitance CpL. A plurality of reference potentials VR, VR/2 and VR/4 are connected to the first conductive line R through first field effect transistor 16, second field effect transistor 18, and third field effect transistor 20, respectively, with ground potential being connected to the first conductive line R through a fourth field effect transistor 22. The plurality of reference potentials VR, VR/2 and VR/4 are connected to the second conductive line L through fifth transistor 24, sixth transistor 26 and seventh transistor 28, respectively, with ground potential being connected to the second conductive line L through eighth transistor 30. Transistors 16, 18, 22, 24, 26 and 30 have gate electrodes 15, 17, 19, 21, 23 and 25, respectively, and the reference potential VR may be equal to 8 volts. The voltage-to-charge transducer is coupled to the first stage of the first CCD storage system via the first N+ diffusion 12 through a potential well 27 formed in the semiconductor substrate under a first gate electrode 31 and the voltage-to-charge transducer is coupled to the input stage of the second CCD storage system via the second N+ diffusion 14 through a potential well 29 formed under a second gage electrode 33. The first gate electrode 31 and the first N+ diffusion 12 form a first input gate diode and the second gate electrode 33 and the second N+ diffusion 14 form a second input gate diode.

The circuit of FIG. 1 is shown substantially embodied in integrated circuit form in the semiconductor substrate 10 in FIG. 2.

FIG. 2 is an isometric view of the integrated circuit having a section taken through first and second N+ diffusions 12 and 14. As shown in FIG. 2, the source electrode for transistors 16, 18 and 22 is the first N+ diffusion 12 and the drain electrode for transistors 16, 18 and 22 is indicated by diffusions at reference numerals 32, 34 and 36, respectively. The source electrode for transistors 24, 26 and 30 is the second N+ diffusion 14 as illustrated in FIG. 2 and the drain electrode for transistors 24, 26 and 30 is indicated at 38, 40 and 42, respectively. In this embodiment the second N+ diffusion 14 is also used as the second conductive line L, but, if desired, other types of conductive lines, such as copper doped aluminum lines, may be used. The capacitor C has as one of its plates the conductive metal plate 44 which may be made of aluminum and as its other plate a portion of the second N+ diffusion 14, with a dielectric medium, for example, silicon dioxide 46, interposed between the conductive plate 44 and the second N+ diffusion 14. The conductive plate 44 is connected to the first N+ diffusion 12 by the first conductive line R through a contact diffusion 48, which may be a heavily doped N+ diffusion within the first N+ diffusion 12. The first and second storage electrodes 11 and 13 of the first and second CCD storage systems and the first and second gate electrodes 31 and 33 are separated from the semiconductor substrate 10 by the dielectric medium 46. Gate electrodes 15, 17, 19, 21, 23 and 25 of transistors 16, 18, 22, 24, 26 and 30, respectively, are also separated from substrate 10 by the dielectric medium 46.

The operation of the circuit illustrated in FIGS. 1 and 2 of the drawing may be more clearly understood by referring to the pulse program indicated in FIG. 3 of the drawing. To inject a charge Q into well 50 under the storage electrode 11 of the first stage of the first CCD storage system, reference may be had to the pulse program starting from time t0 to time t3 of FIG. 3. At time t0, the first conductive line R is set to zero volts or ground by applying a voltage VggR to the gate electrode 19 of transistor 22 and the voltage on the second conductive line L is simultaneously charged to a voltage VR by applying a voltage Vg1 to the gate electrode 21 of transistor 24. With zero volts applied to the first gate electrode 31 and to the second gate electrode 33, the first and second conductive lines R and L are isolated from the first and second CCD storage systems including storage electrodes 11 and 13. At time t1, the voltage on the first gate electrode 31 is raised to approximately 5 volts as indicated by pulse VgR in FIG. 3 and the voltage VggR applied to the gate electrode 19 of transistor 22 is reduced to zero volts to turn off transistor 22 permitting the voltage on the first conductive line R to increase to a voltage VgR minus VtR, where VgR is the voltage on the first gate electrode 31 and VtR is the threshold voltage of the first input gate diode formed by the first gate electrode 31 and the first N+ diffusion 12. The voltage VgR may be equal to 5 volts and the threshold voltage VtR may be equal to 1 volt. With the voltage on the first conductive line R at VgR minus VtR at time t2, the voltage Vg1 on the gate electrode 21 of transistor 24 is reduced to zero to turn off transistor 24 and a voltage VggL is applied to the gate electrode 25 of transistor 30 to discharge the second conductive line L through transistor 30 from the reference potential VR to ground. As the second conductive line L discharges toward ground, due to the capacitive coupling through capacitor C, the first conductive line R tends to become discharged as is indicated at time t2 on curve R, however, line R is quickly recharged to the voltage VgR minus VtR since the voltage VgR is still applied to the gate electrode 31 and the first conductive line R is floating. It can be seen that by utilizing this pulse program a quantity of charge is stored under the first storage electrode 11 in well 50 since reducing the voltage on the second conductive line L from VR to ground injects a quantity of charge Q which is equal to the capacitance of capacitor C times the voltage difference VR, or Q=C×VR.

To store a duplicate packet of charge Q at a point on the semiconductor substrate 10 remote from the first storage electrode 11, the pulse program from time t3 to t6 of FIG. 3 of the drawings is employed which stores the duplicate packet Q in potential well 52 under the second storage electrode 13 of the second CCD storage system. The distance between the first and second storage electrodes 11 and 13 may be any distance between two points on the substrate 10. To store the packet of charge Q under the second storage electrode 13 in well 52, the voltage VgR on the first gate electrode 31 in reduced to zero volts to isolate the first CCD storage system from the first conductive line R at time t3 and the voltage Vg3 is applied to the gate electrode 15 of transistor 16 to apply the reference potential VR to the first conductive line R, while the voltage VggL remains applied to the gate electrode 25 of transistor 30 to maintain the second conductive line L at ground potential. At time t4, the voltage VgL is applied to the second gate electrode 33 to connect the second conductive line L to the second CCD storage system having its first stage identified by the second storage electrode 13. At this time, the voltage VggL applied to the gate electrode 25 of transistor 30 is reduced to zero volts to turn off transistor 30 and to permit the second conductive line L to rise to the voltage VgL minus VtL, where VgL is the voltage on the second gate electrode 33 and VtL is the threshold voltage of the second input gate diode formed by the second gate electrode 33 and the second N+ diffusion 14. The voltage VgL is equal to VgR and the threshold voltage VtL is preferably equal to the threshold voltage VtR. At time t5, when the second conductive line L has reached the voltage magnitude VgL minus VtL, the voltage VggR is applied to the gate electrode 19 of transistor 22 to decrease the voltage on the first conductive line R from the reference potential VR to ground, with the voltage Vg3 applied to the gate electrode 15 of transistor 16 being reduced to zero volts. Reducing the voltage on the first conductive line R tends to reduce the voltage on the second conductive line L which is connected to the first conductive line R through the capacitor C. However, since line L is coupled to the gate electrode 33 to which is applied the voltage VgL, the voltage on the second conductive line L again rises to the voltage level VgL minus VtL. By reducing the voltage on the first conductive line R from VR to ground, a charge Q, which again is equal to C times VR, is injected into well 52 under the second storage electrode 13.

It should be noted that due to the precharging of the lines L and R the effects of the parasitic capacitors CpL and CpR and the threshold voltage tracking do not affect the amount of charge which is being stored in the first and second CCD storage systems. The only factors which determine the quantity of charge produced by the transducer of this invention is the capacitor C and the voltage VR.

It should be understood that the voltages SR and SL applied to the first and second storage electrodes 11 and 13, respectively, may be equal to 10 volts or any other desired voltage provided that each of the voltages SR and SL is higher than a threshold voltage below VgR and VgL, respectively. The voltages SR and SL may be on at all times, if desired, or they may be appropriately pulsed and applied to their associated storage electrodes at least when charge is to pass through the wells 27 and 29 under the electrode gate 31, and 33, respectively, when collecting charge and when precharging the first and second conductive lines R and L. It is to be noted that any charge accumulated in the wells 27 and 29 under the electrode gates 31 and 33 during the precharge periods from time t1 to t2 and time t4 to t5 when line R is being precharged to VgR−VtR and line L to VgL−VtL, respectively, should be removed by any conventional means, such as is disclosed in the commonly assigned U.S. Pat. No. 4,035,667 by drain diode 24 in FIG. 1 thereof composed of N+ type material.

It should be further noted that within the teachings of this invention fractional charge packets such as Q/2 or Q/4 can be provided by simply using voltages VR/2 or VR/4, respectively, in place of the reference potential VR. By reducing the voltage on either of the conductive lines R or L from VR to ground to inject a charge packet Q into a first well and then reducing the voltage on the other line R or L from VR/2 to ground, a charge packet Q/2 is injected into a second well remote from the first well, which may be used, e.g., for charge sensing purposes.

As indicated in FIG. 1, the voltage VR/2 may be applied to the first conductive line R through transistor 18 by applying an appropriate voltage V1 to the gate electrode 17 of transistor 18 and the voltage VR/2 can be applied to the second conductive line L through transistor 26 by applying a voltage V2 to the gate electrode 23 of transistor 26. The voltage VR/4, for producing a charge packet Q/4, can be applied to the first conductive line R by applying the voltage VR/4 through the transistor 20 after applying a voltage V3 to the control electrode of transistor 20 and the voltage VR/4 can be applied to the second conductive line L by applying the voltage VR/4 through the transistor 28 after applying a voltage V4 to the gate electrode of transistor 28. It should be understood that in the interest of clarity in FIG. 2 the transistors 20 and 28 for applying the voltage VR/4 are not shown but could be provided in a similar fashion as are the transistors for applying the voltages VR and VR/2.

It can be seen that the distribution of accurate direct current voltage levels, such as VR, VR/2 and VR/4, provides the generation of equally accurate charge packet levels since the capacitor C is a common capacitor for the generation of all sizes of charge packets. The distribution of the multilevel voltages on a ship supports a mutilevel CCD storage system with a conventional resistive network which may be an off chip digital-to-analog converter. These resistive networks are well known and can readily produce voltages within one percent accuracy.

It should be noted further that since the parasitic capacitances are precharged out of the transducer, the technique of the present invention is readily extendable to duplicate charge packets Q for storage at more than two points on a conductive substrate or chip 10. Where high speed or improved performance is desired, a known feedback circuit may be employed in the transducer, as taught in an article entitled, "A Fast Sample and Hold Charge-Sensing Circuit for Photo Diode Arrays" by P. G. A. Jespers et al, *IEEE Journal of Solid-State Circuits*, Vol. SC-12, No. 3, June 1977, pages 232–237.

Figure 4:
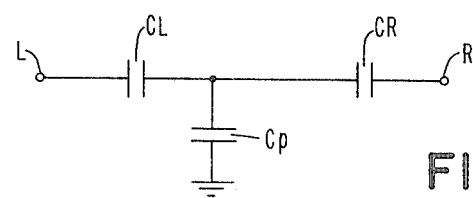
FIG. 4 is a capacitor circuit arrangement which may be substituted for the capacitor circuit of the embodiment of FIG. 1 to form a second embodiment of the present invention.

Although, as shown in FIG. 1, a single capacitor C is connected serially between the first and second conductive lines R and L, it should be understood that a plurality of serially connected capacitors, such as, CL and CR, as indicated in FIG. 4 of the drawing, may interconnect the first and second conductive lines R and L, to provide improved performance. However, it should be noted that in the embodiment of FIG. 4 the parasitic Cp is not precharged by the input gate diodes indicated by gate electrodes 31 and 33 in FIGS. 1 and 2. Accordingly, the duplicate charge packets Q are dependent upon the value of the parasitic capacitor Cp.

It can be seen that this invention takes advantage of the simplicity of transferring voltages from one location to another to inject desired amounts of charge into spaced-apart locations rather than to transfer a charge or charge packet from one location to another which requires the use of a complex charge integrator, such as a bucket brigade device or an operational amplifier. Furthermore, the lengths of the conductive lines L and R need not be equal since parasitic capacitances can be rendered ineffective regardless of magnitude by being precharged to known voltages. Also, the width to length ratio, W/L, of the transistors used in this transducer may conveniently be equal to 1.

While the invention has been particularly shown and described with reference to preferred embodiments thereof, it will be understood by those skilled in the art that various changes in form and details may be made therein without departing from the spirit and scope of the invention.

What is claimed is:

1. A voltage-to-charge transducer comprising;
    first and second spaced apart utilization means for receiving charge,
    capacitive circuit having first and second conducting plates interconnecting said first and second charge utilization means, said first plate being coupled to said first charge utilization means and said second plate being coupled to said second charge utilization means,
    first means including a first charge transfer device for selectively charging a first given point between said first charge utilization means and the first plate of said capacitive circuit through said first charge transfer device to a predetermined voltage magnitude,
    second means including a second charge transfer device for selectively charging a second given point between said second charge utilization means and the second plate of said capacitive circuit through said second charge transfer device to a predetermined voltage magnitude,
    first means for varying the voltage at said second given point between first and second voltage magnitudes when said first given point is charged to its predetermined voltage magnitude, and
    second means for varying the voltage at said first given point to first and second voltage magnitudes when said second given point is charged to its predetermined voltage magnitude, each of said first and second voltage varying means varying said voltage from said first magnitude to said second magnitude having a value more negative than that of said first magnitude and each of said first and second voltage varying means including a first transistor for applying said voltage of first magnitude and a second transistor for providing said voltage of second magnitude.

2. A voltage-to-charge transducer comprising;
    first and second spaced apart utilization means for receiving charge,
    capacitive circuit having first and second conducting plates interconnecting said first and second charge utilization means, said first plate being coupled to said first charge utilization means and said second plate being coupled to said second charge utilization means,
    first means including a first charge transfer device for selectively charging a first given point between said first charge utilization means and the first plate of said capacitive circuit through said first charge transfer device to a predetermined voltage magnitude,
    second means including a second charge transfer device for selectively charging a second given point between said second charge utilization means and the second plate of said capacitive circuit through said second charge transfer device to a predetermined voltage magnitude,
    first means for varying the voltage at said second given point between first and second voltage magnitudes when said first given point is charged to its predetermined voltage magnitude, and
    second means for varying the voltage at said first given point to first and second voltage magnitudes when said second given point is charged to its predetermined voltage magnitude, said first and second voltage magnitudes of said second voltage varying means having a voltage differential different from the voltage differential between said first and second voltage magnitudes of said first voltage varying means.

3. A voltage-to-charge transducer as set forth in claim 2 wherein said first and second voltage magnitudes of said second voltage varying means has a voltage differential less than the voltage differential between said first and second voltage magnitudes of said first voltage varying means.

4. A voltage-to-charge transducer as set forth in claim 2 wherein said second voltage varying means includes a first transistor for applying said voltage of first magnitude and a second transistor for providing said voltage of second magnitude.

5. A voltage-to-charge transducer as set forth in claim 4 wherein said voltage of second magnitude of each of said first and second voltage varying means is a common reference potential.

6. A voltage-to-charge transducer comprising;
    first and second spaced apart utilization means for receiving charge,
    capacitive circuit having first and second conducting plates interconnecting said first and second charge utilization means, said first plate being coupled to said first charge utilization means and said second plate being coupled to said second charge utilization means,
    first means including a first charge transfer device for selectively charging a first given point between said first charge utilization means and the first plate of said capacitive circuit through said first charge transfer device to a predetermined voltage magnitude,
    second means including a second charge transfer device for selectively charging a second given point between said second charge utilization means and the second plate of said capacitive circuit through said second charge transfer device to a predetermined voltage magnitude, first means for varying the voltage at said second given point between first and second voltage magnitudes when said first given point is charged to its predetermined voltage magnitude, and second means for varying the voltage at said first given point to first and second voltage magnitudes when said second given point is charged to its predetermined voltage magnitude, said first and second given points being conductive lines each of a given length with one of said conductive lines being a diffusion in a semiconductor substrate and the other of said conductive lines being a metallic conductor.

7. A voltage-to-charge transducer comprising;

first and second spaced apart utilization means for receiving charge, capacitive circuit having first and second conducting plates interconnecting said first and second charge utilization means, said first plate being coupled to said first charge utilization means and said second plate being coupled to said second charge utilization means, first means including a first charge transfer device for selectively charging a first given point between said first charge utilization means and the first plate of said capacitive circuit through said first charge transfer device to a predetermined voltage magnitude, second means including a second charge transfer device for selectively charging a second given point between said second charge utilization means and the second plate of said capacitive circuit through said second charge transfer device to a predetermined voltage magnitude, first means for varying the voltage at said second given point between first and second voltage magnitudes when said first given point is charged to its predetermined voltage magnitude, and second means for varying the voltage at said first given point to first and second voltage magnitudes when said second given point is charged to its predetermined voltage magnitude, said first and second voltage varying means including transistors for providing a plurality of voltage differentials.

8. A voltage-to-charge transducer as set forth in claim 7 wherein said transistors are field effect transistors and said plurality of voltage differentials have a predetermined relationship to each other.

9. A voltage-to-charge transducer as set forth in claim 7 wherein said capacitive circuit includes a single capacitor.

10. A voltage-to-charge transducer as set forth in claim 7 wherein said capacitive circuit includes serially connected capacitors.

* * * * *